United States Patent [19]

Griffin

[11] Patent Number: 4,461,525
[45] Date of Patent: Jul. 24, 1984

[54] INTEGRATED CIRCUIT TEST SOCKET

[75] Inventor: Wendell L. Griffin, South Bend, Ind.

[73] Assignee: Wells Electronics, Inc., South Bend, Ind.

[21] Appl. No.: 408,868

[22] Filed: Aug. 17, 1982

[51] Int. Cl.³ .......................................... H01R 13/62
[52] U.S. Cl. ............................ 339/75 M; 339/17 CF; 339/176 M
[58] Field of Search ............. 339/17 CF, 74 R, 75 M, 339/75 MP, 176 M, 176 MP

[56] References Cited

U.S. PATENT DOCUMENTS

| | | | |
|---|---|---|---|
| 3,710,299 | 1/1973 | Weisenburger | 339/17 CF |
| 4,077,688 | 3/1978 | Cobaugh et al. | 339/74 R |
| 4,148,537 | 4/1979 | Sochor | 339/74 R |

*Primary Examiner*—John McQuade
*Attorney, Agent, or Firm*—James D. Hall

[57] ABSTRACT

A test socket which is for an integrated circuit device and which includes clamp wings pivotally mounted to the socket frame side faces. Each clamp wing includes conductive biased leads terminating in contacts which overlie and contact the leads of the integrated circuit device, serving to retain the device within the socket frame while completing an electrical circuit between a printed circuit board and the integrated circuit device.

14 Claims, 8 Drawing Figures

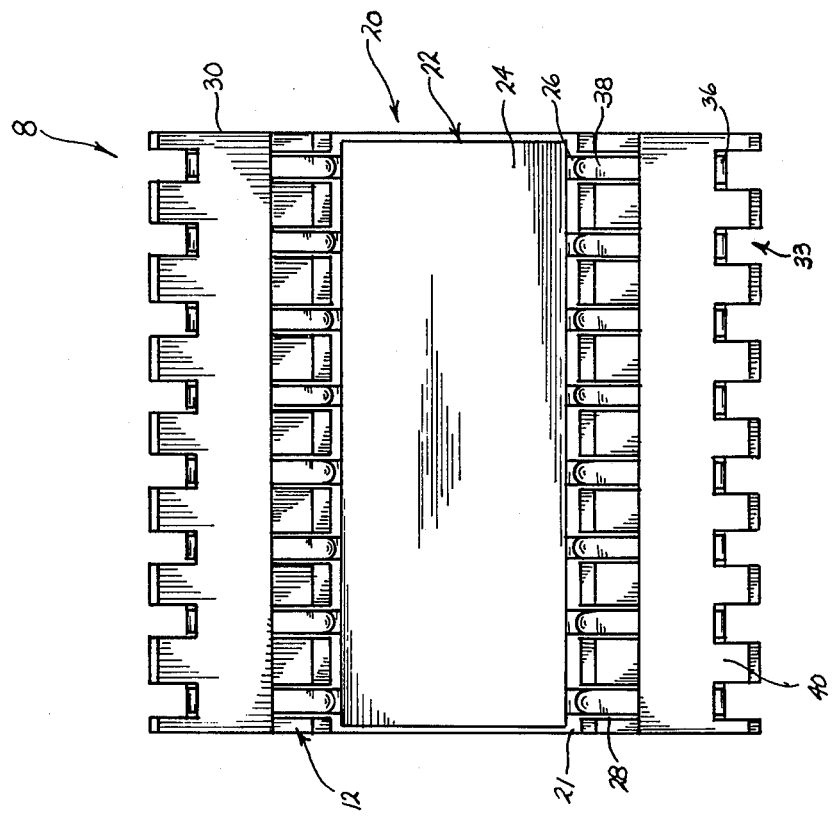
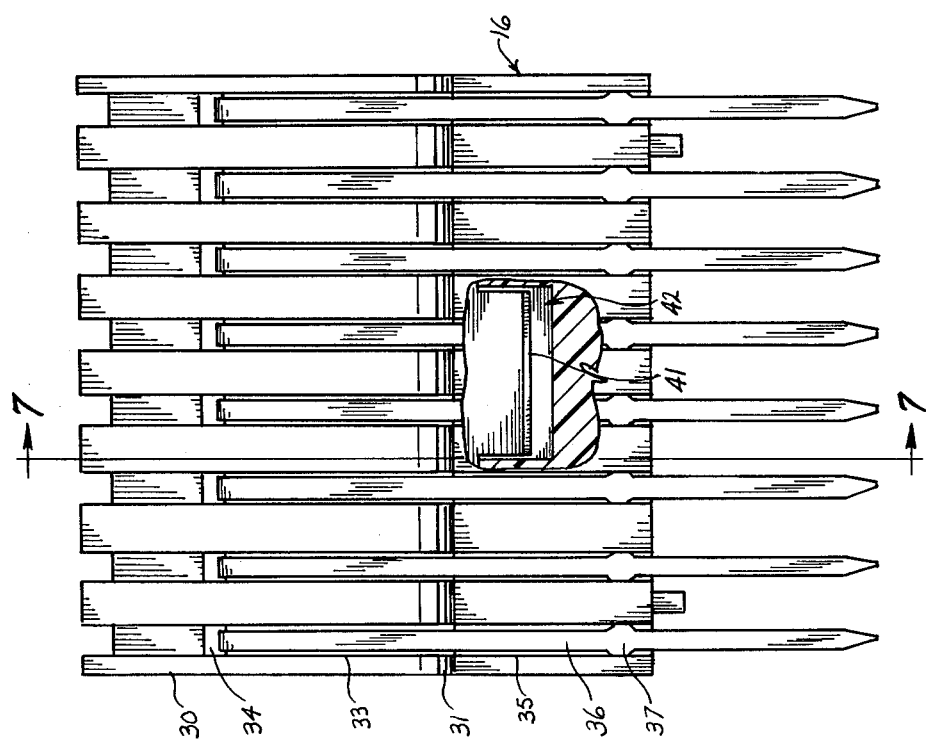

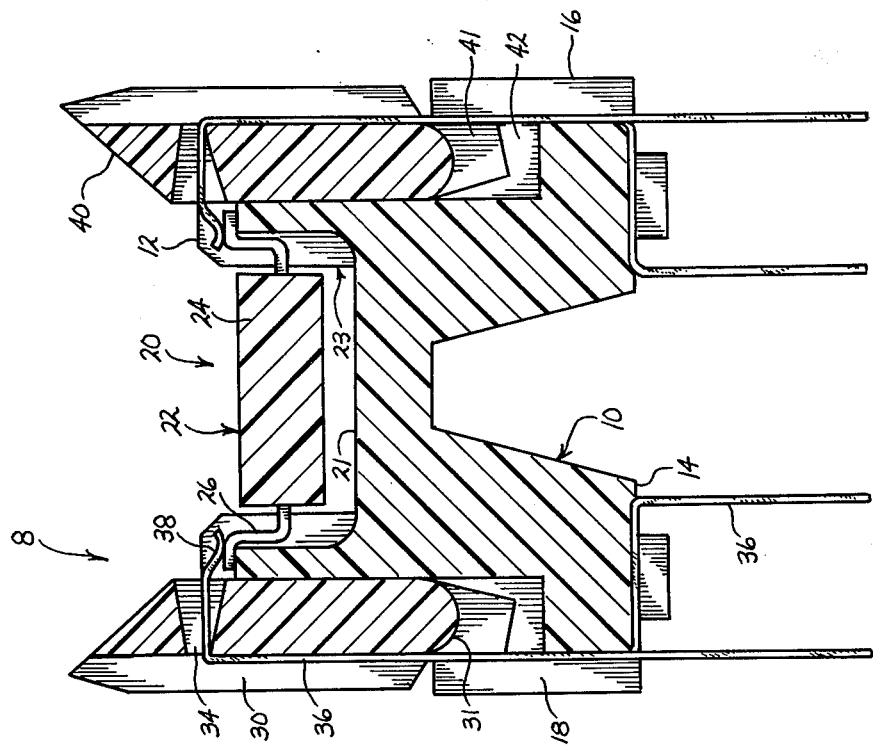
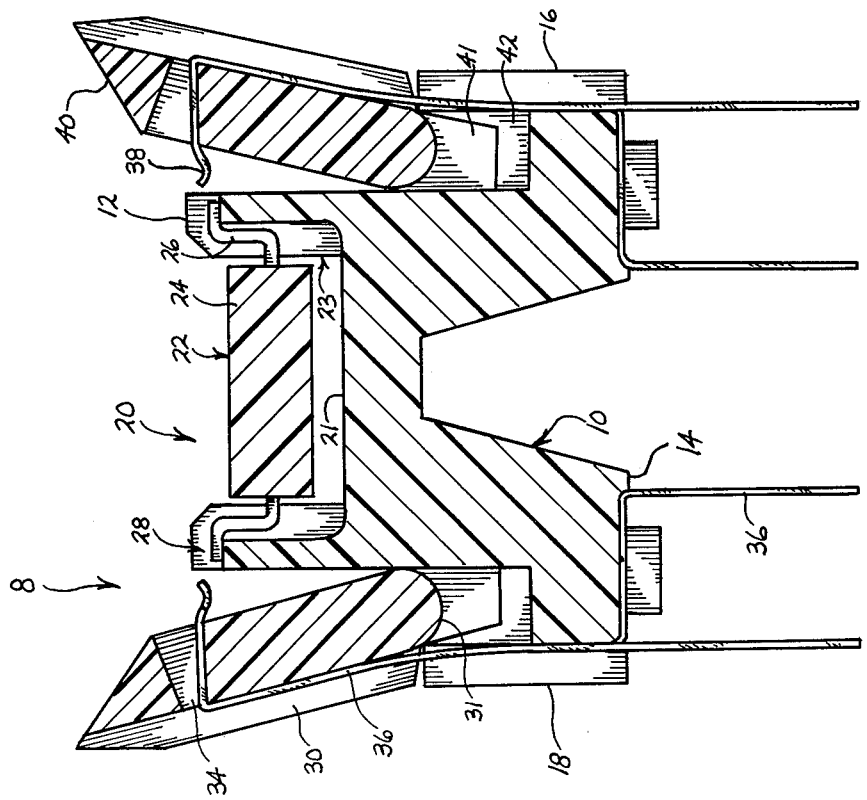

INTEGRATED CIRCUIT TEST SOCKET

BACKGROUND OF THE INVENTION

This invention relates to a test socket for an integrated circuit chips or device and will have specific application to small outline integrated circuit devices.

Recently, small outline (SO) type integrated circuits have been gaining popularity in the electronics field. The SO package is substantially smaller in size than a standard dual-in-line package (DIP) equivalent. Its ease of circuit board assembly and smallness of size are advantages over the other types of integrated circuit devices.

Integrated circuit devices must be statistically, and sometimes each individually, tested for electrical performance properties and ability to perform under extreme heat. For the SO, because of its smallness, this creates a handling problem. Previous test sockets included hinged tops or caps to secure the SO's within the sockets and required each SO to be individually inserted into a socket by hand, often using tweezers to align the leads of the SO within the socket. After SO insertion, the hinged top of the socket must be closed. This procedure is time consuming and not always accurate due to human error. Such sockets are large and take up a great amount of space upon the printed circuit board or other power source.

In the following, a new test socket will be described which efficiently accommodates integrated circuit devices such as the SO.

SUMMARY OF THE INVENTION

In this invention the test socket is contructed with one or more clamp wings pivotally mounted to the socket base and shiftable between open and closed positions. Each wing carries a contact which is adapted to overlie and contact the leads of a SO positioned upon the socket base when the wing is in its closed position. Each wing contact is adapted for connection with a printed circuit board.

The socket is constructed to accept a SO device having a number of formed leads and can also accept multiple SO devices. The sockets may be placed end to end upon a printed circuit board to accommodate elongated integrated circuit devices and to provide high socket density upon the board.

Accordingly, it is an object of this invention to provide a test socket which is for an integrated circuit device and which is economical and easy to use.

Another object is to provide a test socket which is for an integrated circuit device and which can be utilized in greater numbers on a single printed circuit board.

Another object is to provide a test socket which is for an integrated circuit device and which provides for effective air flow during testing operations.

Still another object is to provide a test socket which is for an integrated circuit device and which is easily adaptable to automated loading and unloading.

And still another object is to provide an integrated circuit device test socket which allows for probe testing as well as fixed lead testing and for ease of IC device marking.

Other objects will become apparent upon a reading of the following description.

BRIEF DESCRIPTION OF THE DRAWINGS

FIG. 4 is a side view of the socket of FIG. 1 with portions of the side broken away for purposes of illustration.

FIG. 5 is a top view of the socket of FIG. 3.

FIG. 6 is a sectional view of the socket with the wings therof shown in their open position.

FIG. 7 is a sectional view of the socket, similar to FIG. 6, and taken along line 7—7 of FIG. 4 but with the wings shown in their closed position.

DESCRIPTION OF THE PREFERRED EMBODIMENTS

Figure 3:
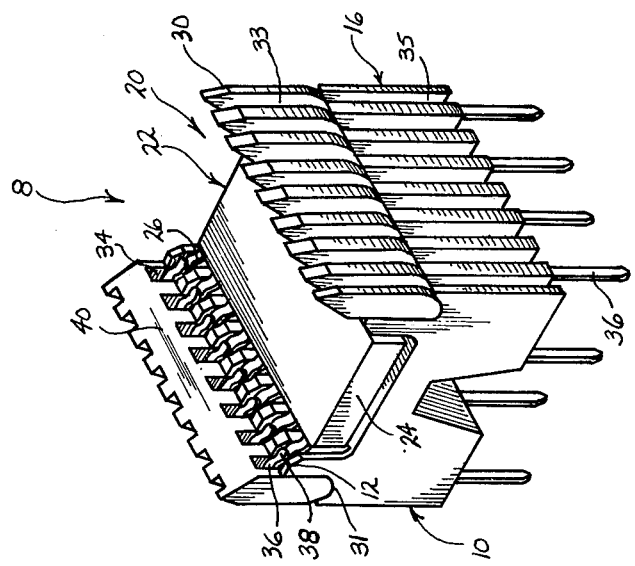
FIG. 3 is a perspective view of the socket of FIG. 1 with an integrated circuit in place and the clamp wings shown closed.
Figure 2:
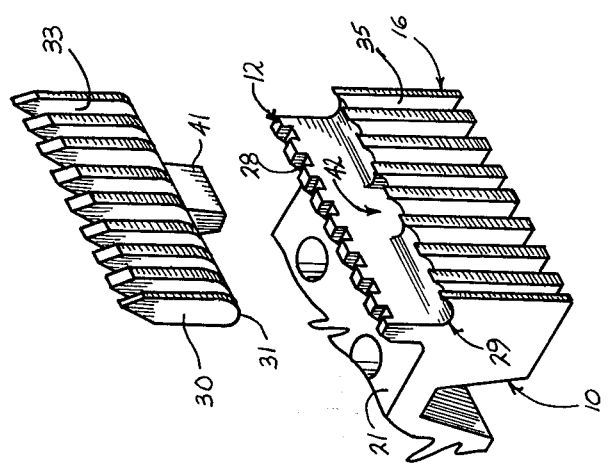
FIG. 2 is fragmentary perspective view of one side of the socket of FIG. 1 showing a clamp wing in separated form for purposes of illustration.

The preferred embodiments illustrated are not intended to be exhaustive or to limit the invention to the precise forms disclosed. They are chosen and described to best explain the principles of the invention so that others skilled in the art may utilize the invention.

The test socket 8 shown in FIGS. 1–7 has a base 10 which includes an upper face 12, lower face 14, and side faces 16, 18. Base upper face 12 preferably includes a center cavity 20 which acts as a device receiving opening. Cavity 20 terminates in a bottom wall part 21 and includes side wall parts 23. Spaced grooves 28 are formed in each base side wall part 23 and extend into base upper face 12.

A longitudinal channel 29 is formed in base 10 at each intersecting corner of its upper face 12 and side face 16, 18. A clamp wing 30 is pivotally carried at its rounded bottom part 31 within each base channel 29. Each wing 30 has grooves 33 formed in its outer side face which are aligned with the adjacent grooves 35 in side faces 16, 18 of base 10. An opening 34 extends through each wing 30 at each groove 33 and is aligned with a groove 28 in base side wall parts 23 and upper face 12. Base 10 and wings 30 are formed of a plastic or other non-conductive material.

Figure 1:
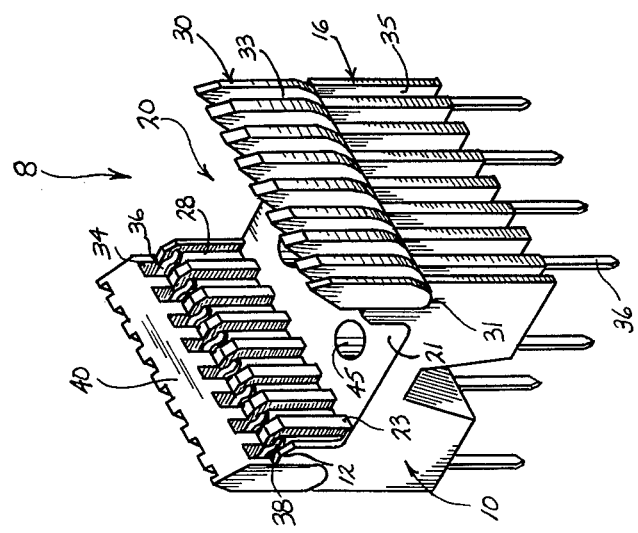
FIG. 1 is a perspective view of one embodiment of the test socket of this invention with the clamp wings thereof shown in their closed position.

A selected number of aligned grooves 33, 35, and 28 in wing 30 and base 10 receive a conductive, flexible shape-retaining lead 36. Each lead 36 terminates in a contact 38 which extends through the aligned wing opening 34 and which is located adjacently over base upper face 12 within aligned groove 28 therein when the contacting wing 30 is urged by the lead into the closed position as shown in FIGS. 1 and 7. Wings 30 are shiftable into the open position shown in FIG. 6 where the wings and contacts 38 extend outwardly of base upper face 12 with leads 36 being correspondingly flexed. Leads 36 each include tabs 37 which engage and interlock with the side walls of base grooves 35 to secure the leads to base 10.

The integrated circuit (IC) device 22 for socket 8 includes a body 24 and formed leads 26 which extend from either side of the device body. The number of IC device leads 26 will vary depending upon the size and functional purpose of the IC device. Each socket wing 30 is preferably constructed to include an angled upper top face 40. This construction allows an opening tool to be used to urge wings 30 into their open position to receive or release IC device 22. Body 24 of device 22 is fitted within body cavity 20 with leads 26 thereof fitting into respective grooves 28 of the base. The foot part of IC leads 26 rest upon base upper face 12 with the body 24 of the IC preferably spaced from base cavity wall part 21 to allow for air circulation. Wings 30 are now permitted to shift into their closed position under the influence of leads 36. As each wing 30 closes, contacts 38 slide over device leads 26, wiping any oxidation material from the device leads. The flaring of wing openings 34 allow for the flexure of contacts 38 as they engage IC leads 26. With wings 30 in their closed position, IC device 22 is secured within base cavity 20, and electrical testing of the IC device can begin. Leads 36 project below base lower face 14 and can be bent to accommodate soldering to a printed circuit board. When wings 30 are opened, IC device 22 can be removed. Each wing 30 includes a tab 41 extending from its bottom part 31 which projects into a cavity 42 within base side faces 16, 18 and which acts as a stop for limiting pivotal movement of the wing.

IC device 22 is retained within socket 8 in a manner which allows rapid cooling of the IC during testing operations. An opening 45 may be formed in base lower face 14 which extends to cavity bottom wall 21, allowing for additional cooling and, if desired, the insertion of an ejector rod to push the IC device from the socket when testing is completed and wings 30 opened.

Figure 8:
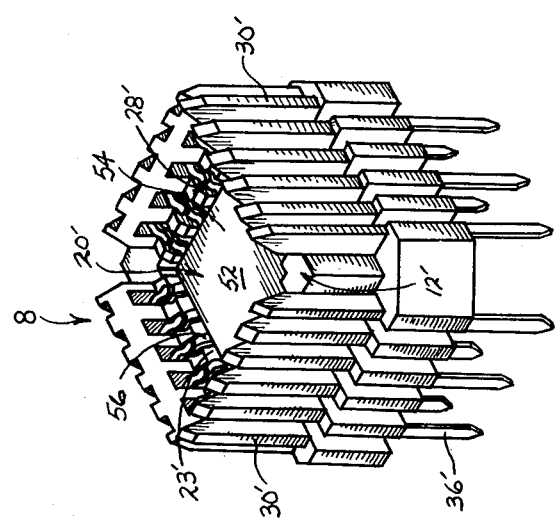
FIG. 8 is a perspective view of another embodiment of the test socket of this invention.

A second embodiment of this invention is illustrated in FIG. 8 showing a socket 8' accommodating a quad-pack type of integrated circuit device 52. Socket 8' includes a center cavity 20' for housing the body 54 of device 52. Device leads 56 extend from all four sides of body 54 and are fitted within spaced base grooves 28' located in opposite sides of base side walls 23' and upper face 12'. Four clamp wings 30', one at each side face of base 10' and carrying leads 36', are pivotally mounted to the base. The manner of operation of wings 30' and their respective leads 36' is similar to the operation of wings 30 and leads 36 shown in FIGS. 1–7.

It is to be understood that the invention is not to be limited to the description above given and that it may be modified within the scope of the appended claims.

I claim:

1. A test socket for an integrated circuit device having a body with leads extending therefrom, said socket comprising a base having upper and lower faces and spaced side faces, said base upper face adapted to accommodate said device body with said device leads overlying said upper face, a clamp wing pivotally mounted to said base adjacent a said side face thereof, said wing being shiftable between an open position wherein the wing extends outwardly of said base upper face and a closed position wherein the wing is located adjacent the base upper face, and biasing means contacting said wing and base for urging said wing into its said closed position, a conductive contact means carried by and extending laterally from said wing; said contact means for wiping across said device leads as said wing is urged into its said closed position and for overlying and contacting said device leads when said wing is in its said closed position to create an electrical connection between the socket and device leads.

2. The socket of claim 1 wherein said base upper face has a device-receiving opening formed therein, said device-receiving opening for accommodating the body of said device, oppositely spaced grooves extending along said base upper face to said device-receiving opening, said grooves for receiving the leads of said device.

3. The socket of claim 1 wherein said biasing means constitutes a conductive extension of said contact means.

4. The socket of claim 3 wherein said biasing means extends downwardly from said base and constitutes lead means for connecting said socket to a power source.

5. The socket of claim 2 wherein said device-receiving opening terminates in a bottom wall located between said base upper and lower faces.

6. The socket of claim 1 and a second clamp wing pivotally mounted to said base adjacent an opposite side face from said first mentioned wing, said second mentioned wing being shiftable between an open position where the wing extends outwardly of said base upper face and a closed position wherein the wing is located adjacent the base upper face, and biasing means contacting said second mentioned wing and said base for urging the wing into its closed position, a second conductive contact means carried and extending laterally from by said second mentioned wing, said second contact means for wiping across said device leads as said second mentioned wing is urged into its said closed position and for overlying and contacting said device leads when said second mentioned wing is in its closed position to create an electrical connection between the socket and device leads.

7. The socket of claim 6 wherein said second mentioned biasing means constitutes a conductive extension of each second contact means and extends downwardly from said base to form leads for connecting said socket to a power source.

8. The socket of claim 7 wherein one of said wings includes at least two of said contact means and associated leads.

9. The socket of claim 8 wherein said wings include an angled upper face whereby said wings may be urged into their said open position by a wing opening tool.

10. The socket of claim 6 wherein each wing includes a stop means engageable with said base for limiting outward shifting movement of the wings into their open position.

11. The test socket of claim 1 wherein said socket base includes shoulder means for supporting said device leads, said contact means overlying said shoulder means when said wing is in its said closed position.

12. The test socket of claim 3 wherein one of said base side faces has an exterior groove therein extending between said base upper and lower faces, said biasing means positioned within said base groove.

13. The test socket of claim 7 wherein said base side faces have exterior grooves therein extending between said base upper and lower faces, said first and second mentioned biasing means positioned within said base grooves.

14. The test socket of claim 6 wherein said socket base includes shoulder means for supporting said device leads, said first mentioned and second contact means overlying said shoulder means when said first and second mentioned wings are in their closed positions.

* * * * *